(12) United States Patent
Karrat et al.

(10) Patent No.: US 11,039,556 B2
(45) Date of Patent: *Jun. 15, 2021

(54) DATA CENTER COOLING SYSTEM

(71) Applicant: International Business Machines Corporation, Armonk, NY (US)

(72) Inventors: Wally Karrat, Danbury, CT (US); Lin Heng Lee, Singapore (SG); Daniel Pare, Quebec (CA)

(73) Assignee: International Business Machines Corporation, Armonk, NY (US)

( * ) Notice: Subject to any disclaimer, the term of this patent is extended or adjusted under 35 U.S.C. 154(b) by 11 days.

This patent is subject to a terminal disclaimer.

(21) Appl. No.: 16/421,605

(22) Filed: May 24, 2019

(65) Prior Publication Data

US 2019/0281732 A1 Sep. 12, 2019

Related U.S. Application Data

(63) Continuation of application No. 15/611,879, filed on Jun. 2, 2017, now Pat. No. 10,398,065.

(51) Int. Cl.
  *G06F 1/20* (2006.01)
  *H05K 7/20* (2006.01)
  (Continued)

(52) U.S. Cl.
  CPC .......... *H05K 7/20836* (2013.01); *F24F 11/00* (2013.01); *G05B 15/02* (2013.01);
  (Continued)

(58) Field of Classification Search
  CPC ....... F24F 11/00; G05B 19/048; G05B 15/02; G06F 1/206; H05K 7/20745; H05K 7/20836

See application file for complete search history.

(56) References Cited

U.S. PATENT DOCUMENTS 6,305,180 B1 10/2001 Miller et al.
7,315,448 B1 1/2008 Bash et al.
(Continued)

OTHER PUBLICATIONS

Appendix P, "List of IBM Patents or Patent Applications Treated as Related", Mar. 26, 2020, 2 pages.

(Continued)

*Primary Examiner* — Chun Cao
(74) *Attorney, Agent, or Firm* — Jay Wahlquist; Madeline F. Schiesser; Keohane & D'Alessandro, PLLC

(57) ABSTRACT

Approaches presented herein enable cooling a data center with a cooling system having a relatively high coolant temperature. This cooling system is controlled by a building management system and includes piping through which coolant flows, an air cooling unit in thermal contact with the coolant, and a chiller to cool the coolant to a temperature between 18 and 22 degrees Celsius as instructed by the building management system. The building management system uses a chiller controller to vary the chilling of coolant within a range of 18-22 degrees Celsius, thereby controlling the air temperature within the data center to within a required temperature range. Because the building management system maintains the coolant temperature to 18-22 degrees Celsius, the cooling system can be simplified by excluding typical cooling system components such as variable flow control valves and their controllers. This simplification decreases the need for maintenance and reduces operating cost.

20 Claims, 6 Drawing Sheets

(51) Int. Cl.
    *G05B 19/048*     (2006.01)
    *G05B 15/02*     (2006.01)
    *F24F 11/00*     (2018.01)

(52) U.S. Cl.
    CPC ........... *G05B 19/048* (2013.01); *G06F 1/206* (2013.01); *H05K 7/20745* (2013.01)

(56) References Cited

U.S. PATENT DOCUMENTS

| | | | |
|---|---|---|---|
| 7,788,941 | B2 | 9/2010 | Campbell et al. |
| 7,866,173 | B2* | 1/2011 | Brunschwiler ........ G06Q 10/06 62/185 |
| 8,351,200 | B2* | 1/2013 | Arimilli ............ H05K 7/20745 361/679.53 |
| 8,554,390 | B2 | 10/2013 | Canney et al. |
| 8,789,384 | B2 | 7/2014 | Eckberg et al. |
| 9,410,751 | B2 | 8/2016 | David et al. |
| 9,445,529 | B2 | 9/2016 | Chainer et al. |
| 10,398,065 | B2* | 8/2019 | Karrat .................... G05B 15/02 |
| 2009/0126909 | A1* | 5/2009 | Ellsworth, Jr. ...... H05K 7/2079 165/104.33 |
| 2010/0146996 | A1 | 6/2010 | Campbell et al. |
| 2011/0056675 | A1 | 3/2011 | Barringer et al. |
| 2011/0060470 | A1 | 3/2011 | Campbell et al. |
| 2011/0063792 | A1 | 3/2011 | Schmidt et al. |
| 2012/0120603 | A1 | 5/2012 | Campbell et al. |
| 2014/0000847 | A1 | 1/2014 | Leonard et al. |
| 2014/0053588 | A1 | 2/2014 | Karrat et al. |
| 2015/0156926 | A1 | 6/2015 | Levesque |
| 2016/0128238 | A1 | 5/2016 | Shedd et al. |
| 2016/0242326 | A1 | 8/2016 | Edwards et al. |
| 2018/0352683 | A1 | 12/2018 | Karrat et al. |

OTHER PUBLICATIONS

Evans, Tony, "The Different Types of Air Conditioning Equipment for IT Environments", White Paper #59, American Power Conversion, 2004, 21 pgs.

Unknown, "Data Centre Cooling Best Practice", Release 2, Apr. 2008, Stulz, 2008, 10 pgs.

Unknown, "Free Cooling Concepts for Data Centers", Nortek Air Solutions, 2015, 3 pgs.

Iyengar, Madhusudan et al., "Server Liquid Cooling with Chillerless Data Center Designs", 28th IEEE Semi-Therm Symposium, 2012, 12 pgs.

Unknown, "Flexible datacenters", ip.com, IPCOM000225162D, Jan. 28, 2013, 5 pgs.

Unknown, "Heat exchanger for energy efficient data center", ip.com, IPCOM000219103D, Jun. 19, 2012, 5 pgs.

Chun Cao, USPTO Office Action, U.S. Appl. No. 15/611,879, Notification dated Nov. 6, 2018, 13 pages.

Chun Cao, USPTO Notice of Allowance and Fees Due, U.S. Appl. No. 15/611,879, dated Apr. 17, 2019, 5 pages.

* cited by examiner

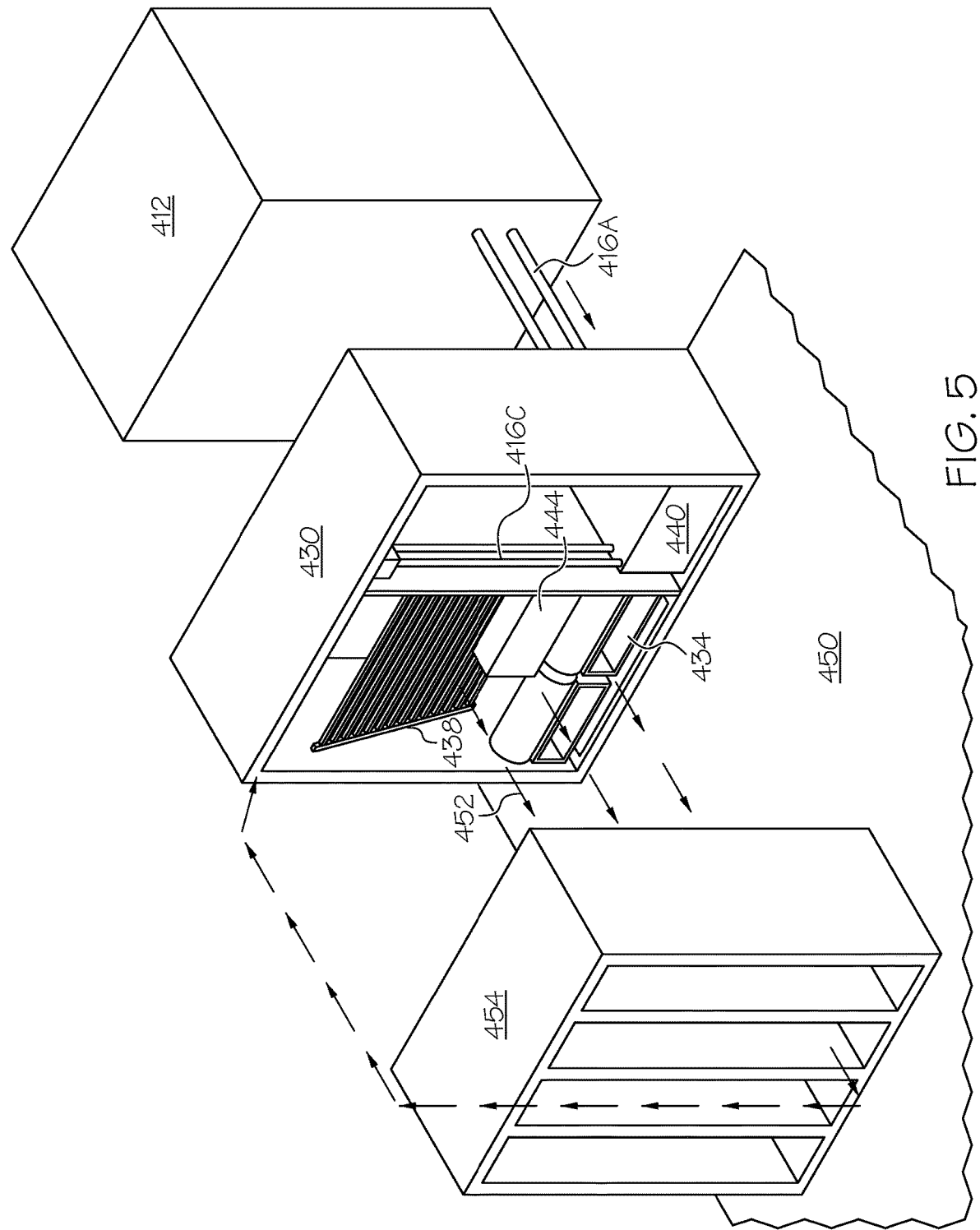

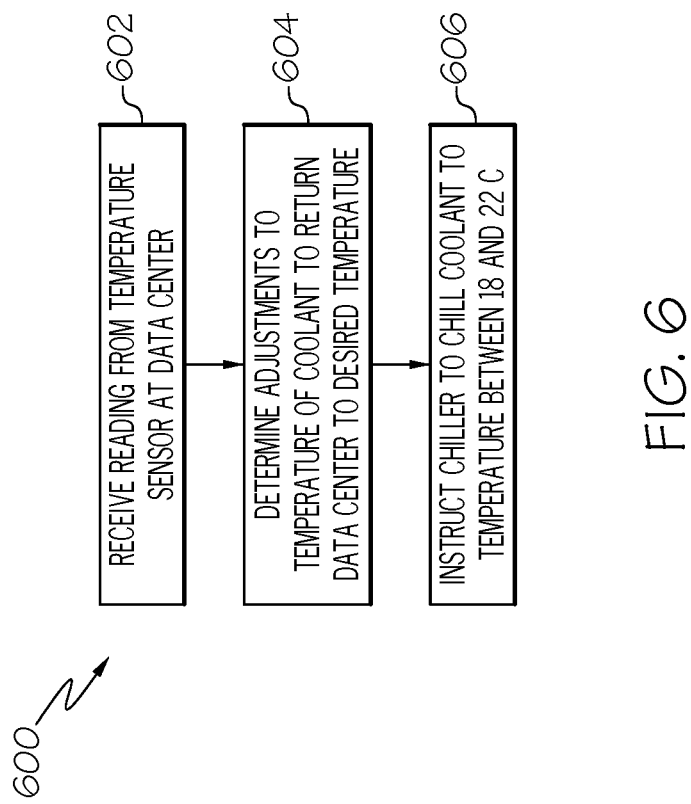

DATA CENTER COOLING SYSTEM

RELATED APPLICATION DATA

The present patent document is a continuation of U.S. patent application Ser. No. 15/611,879, filed Jun. 2, 2017, entitled "DATA CENTER COOLING SYSTEM", the disclosure of which is incorporated herein by reference.

TECHNICAL FIELD

The present invention relates generally to data center cooling systems and, more specifically, to a modified data center cooling system having a relatively high chilled coolant temperature.

BACKGROUND

Large-scale computer systems and servers are crucial components of modern-day business. Many organizations rely on these systems to store and process data associated with that organization. Some organizations choose to own and maintain large-scale computer systems or servers on-site, either in a dedicated building or in a building that is also occupied by people, such as employees. However, as the need for computing power grows, many organizations instead may choose to pay for use of a third-party's computer system or server or to house their large-scale computer systems off-site. These off-site and third-party systems are generally located in massive data centers that can house hundreds, if not thousands, of individual server units.

Computer systems and, more specifically, computer processors generate heat when operating. This heat, if sufficiently concentrated, can harm the computer systems, decreasing computing efficiency and, in some cases, permanently damaging computer hardware. When many computer systems are within the same room or under the same roof, this heat generation issue is further exacerbated. Therefore, particularly in large data centers, it becomes necessary to cool the data center in order to dissipate this heat before it can cause damage.

Server rooms and data centers can use cooling techniques to facilitate cooling of the server machines housed therein. For example, in some server rooms and data centers, cool air is forced into the room to displace heated air and to absorb excess heat from server machines. These servers are typically stored on shelving-like racks to allow airflow through each server. The floor of a server room can also be raised to allow the cooler air to enter the room through holes in grates, perforated tiles, or other openings in the raised floor. The displaced heated air can be drawn out of the room through ventilation systems or similar systems. In some instances, cold water or another coolant can be used to chill the air before it is introduced into the server room.

SUMMARY

In general, embodiments described herein provide for cooling a data center with a cooling system having a relatively high coolant temperature. This cooling system is controlled by a building management system and includes piping through which coolant flows, an air cooling unit in thermal contact with the coolant, and a chiller to cool the coolant to a temperature between 18 and 22 degrees Celsius as instructed by the building management system. The building management system uses a chiller controller to vary the chilling of coolant within a range of 18 to 22 degrees Celsius, thereby controlling the air temperature within the data center to within a required temperature range. Because the building management system maintains the coolant temperature to between 18 and 22 degrees Celsius, the cooling system can be simplified by excluding typical cooling system components such as variable flow control valves and their controllers. This simplification decreases the need for maintenance and reduces operating cost.

One aspect of the present invention includes a system for cooling a data center, the system comprising: a cooling system comprising: a closed circuit of piping through which a coolant flows; a coolant chilling unit; an air cooling unit, wherein the coolant flows from the coolant chilling unit to the air cooling unit via the piping uninterrupted by any flow control mechanism; and a flow control mechanism; and a building management system comprising: a memory medium comprising program instructions; a bus coupled to the memory medium; and a processor, for executing the program instructions, that when executing the program instructions causes the building management system to cause the flow control mechanism to control the flow of coolant through the closed circuit of piping.

Another aspect of the present invention includes a method for cooling a data center with a cooling system, the method comprising: receiving a reading from a temperature sensor located in the data center; determining, based on the received reading, a set of adjustments to a flow of coolant to most efficiently return the data center to a desired temperature; and adjusting a flow of the coolant through the cooling system only though a control mechanism disposed downstream from the data center, between the data center and a chiller unit.

Yet another aspect of the present invention includes a computer program product for cooling a data center with a cooling system, the computer program product comprising a computer readable storage device, and program instructions stored on the computer readable storage device, to: receive a reading from a temperature sensor located in the data center; determine, based on the received reading, a set of adjustments to a flow of coolant to most efficiently return the data center to a desired temperature; and adjust a flow of the coolant through the cooling system only though a control mechanism disposed downstream from the data center, between the data center and a chiller unit.

Still yet, any of the components of the present invention could be deployed, managed, serviced, etc., by a service provider who offers to implement passive monitoring in a computer system.

Embodiments of the present invention also provide related systems, methods, and/or program products.

BRIEF DESCRIPTION OF THE SEVERAL VIEWS OF THE DRAWINGS

These and other features of this invention will be more readily understood from the following detailed description of the various aspects of the invention taken in conjunction with the accompanying drawings in which:

FIG. 5 shows a three-dimensional model of the data center or server cooling system of FIG. 4 according to illustrative embodiments.

FIG. 6 shows a process flowchart for cooling a data center with a cooling system having a relatively high chilled coolant temperature according to illustrative embodiments.

Figure 1:
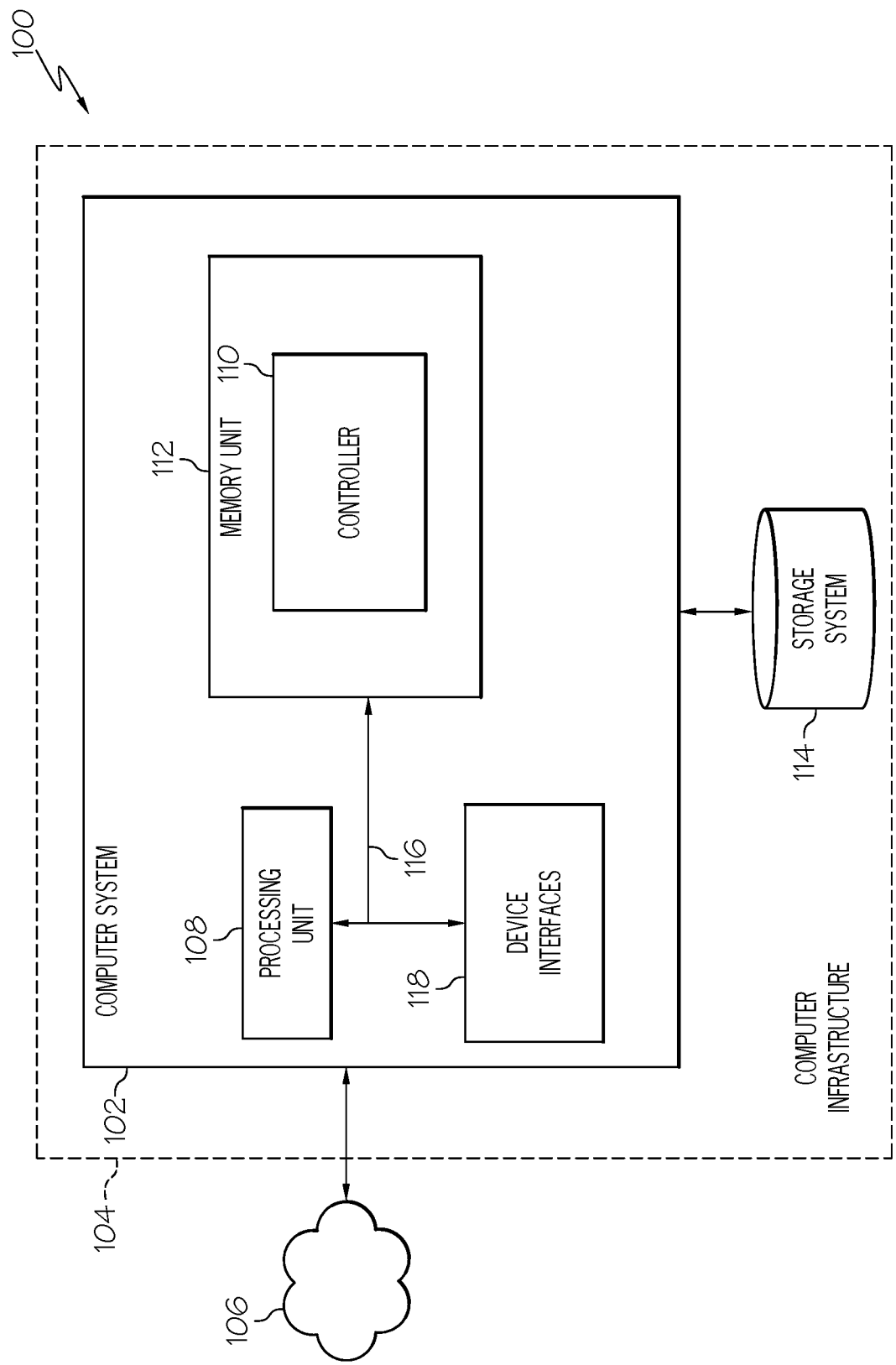
FIG. 1 shows an architecture in which the invention may be implemented according to illustrative embodiments.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Illustrative embodiments will now be described more fully herein with reference to the accompanying drawings, in which illustrative embodiments are shown. It will be appreciated that this disclosure may be embodied in many different forms and should not be construed as limited to the illustrative embodiments set forth herein. Rather, these embodiments are provided so that this disclosure will be thorough and complete and will fully convey the scope of this disclosure to those skilled in the art.

Furthermore, the terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. Furthermore, similar elements in different figures may be assigned similar element numbers. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Unless specifically stated otherwise, it may be appreciated that terms such as "processing," "detecting," "determining," "evaluating," "receiving," or the like, refer to the action and/or processes of a computer or computing system, or similar electronic data center device that manipulates and/or transforms data represented as physical quantities (e.g., electronic) within the computing system's registers and/or memories into other data similarly represented as physical quantities within the computing system's memories, registers or other such information storage, transmission, or viewing devices. The embodiments are not limited in this context.

As stated above, embodiments described herein provide for cooling a data center with a cooling system having a relatively high coolant temperature. This cooling system is controlled by a building management system and includes piping through which coolant flows, an air cooling unit in thermal contact with the coolant, and a chiller to cool the coolant to a temperature between 18 and 22 degrees Celsius as instructed by the building management system. The building management system uses a chiller controller to vary the chilling of coolant within a range of 18 to 22 degrees Celsius, thereby controlling the air temperature within the data center to within a required temperature range. Because the building management system maintains the coolant temperature to between 18 and 22 degrees Celsius, the cooling system can be simplified by excluding typical cooling system components such as variable flow control valves and their controllers. This simplification decreases the need for maintenance and reduces operating cost.

With reference now to the figures, FIG. 1 depicts a computerized implementation 100 that performs embodiments of the present invention. Computerized implementation 100 is only one example of a suitable implementation and is not intended to suggest any limitation as to the scope of use or functionality of embodiments of the invention described herein. Regardless, computerized implementation 100 is capable of being implemented and/or performing any of the functionality set forth hereinabove.

In computerized implementation 100, there is a computer system/server 102, which is operational with numerous other general purpose or special purpose computing system environments or configurations. Examples of well-known computing systems, environments, and/or configurations that may be suitable for use with computer system/server 102 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

As shown, computer system/server 102 can be deployed within a computer infrastructure 104. This is intended to demonstrate, among other things, that embodiments can be implemented within a network environment 106 (e.g., the Internet, a wide area network (WAN), a local area network (LAN), a virtual private network (VPN), etc.), a cloud-computing environment, or on a stand-alone computer system. Communication throughout the network can occur via any combination of various types of communication links. For example, the communication links can comprise addressable connections that may utilize any combination of wired and/or wireless transmission methods. Where communications occur via the Internet, connectivity could be provided by conventional TCP/IP sockets-based protocol, and an Internet service provider could be used to establish connectivity to the Internet. Still yet, computer infrastructure 104 is intended to demonstrate that some or all of the components of computerized implementation 100 could be deployed, managed, serviced, etc., by a service provider who offers to implement, deploy, and/or perform the functions of the present invention for others.

Computer system/server 102 is intended to represent any type of computer system that may be implemented in deploying/realizing the teachings recited herein. Computer system/server 102 may be described in the general context of computer system/server executable instructions, such as program modules, being executed by a computer system. Generally, program modules may include routines, programs, objects, components, logic, data structures, and so on, that perform particular tasks or implement particular abstract data types. In this particular example, computer system/server 102 represents an illustrative system for performing embodiments of the present invention. It should be understood that any other computers implemented under various embodiments may have different components/software, but can perform similar functions. As shown, computer system/server 102 includes a bus 116 and device interfaces 118.

Bus 116 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

As shown, computer system/server 102 includes a processing unit 108 capable of operating with a controller 110 stored in a memory unit 112 to perform embodiments of the present invention, as will be described in further detail below. Processing unit 108 refers, generally, to any apparatus that performs logic operations, computational tasks, control functions, etc. A processor may include one or more subsystems, components, and/or other processors. A processor will typically include various logic components that operate using a clock signal to latch data, advance logic states, synchronize computations and logic operations, and/or provide other timing functions. During operation, processing unit 108 collects and routes signals representing inputs and outputs between external devices and input devices (not shown). The signals can be transmitted over a LAN and/or a WAN (e.g., T1, T3, 56 kb, X.25), broadband connections (ISDN, Frame Relay, ATM), wireless links (802.11, Bluetooth, etc.), and so on. In some embodiments, the signals may be encrypted using, for example, trusted key-pair encryption. Different systems may transmit information using different communication pathways, such as Ethernet or wireless networks, direct serial or parallel connections, USB, Firewire®, Bluetooth®, or other proprietary interfaces. (Firewire is a registered trademark of Apple Computer, Inc. Bluetooth is a registered trademark of Bluetooth Special Interest Group (SIG)).

In general, processing unit 108 executes computer program code, such as program code for operating controller 110, which is stored in memory unit 112 and/or storage system 114. While executing computer program code, processing unit 108 can read and/or write data to/from memory unit 112 and storage system 114. Storage system 114 may comprise VCRs, DVRs, RAID arrays, USB hard drives, optical disk recorders, flash storage devices, and/or any other data processing and storage elements for storing and/or processing data. Although not shown, computer system/server 102 could also include I/O interfaces that communicate with one or more hardware components of computer infrastructure 104 that enable a user to interact with computer system/server 102 (e.g., a keyboard, a display, a camera, etc.).

Figure 2:
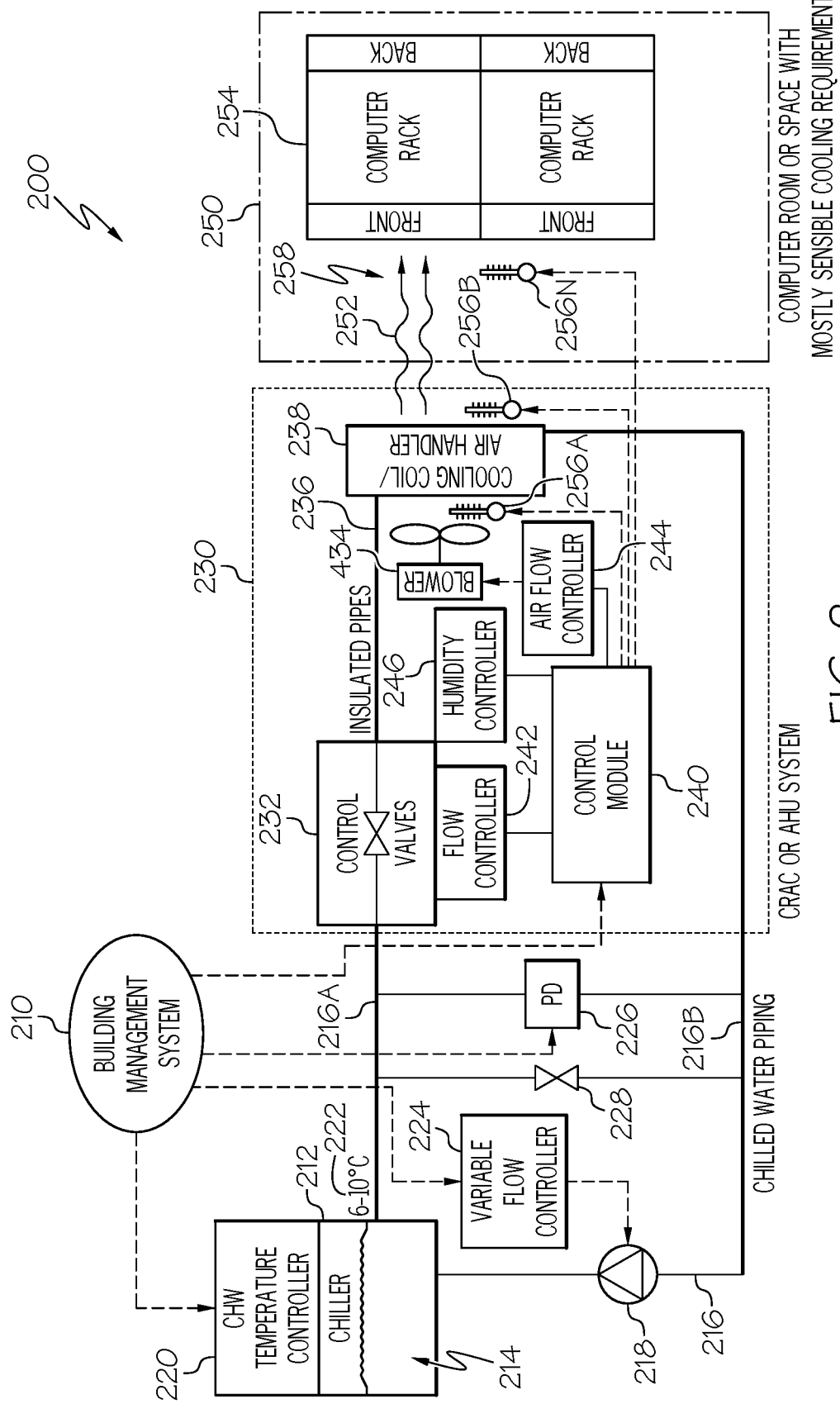
FIG. 2 shows a schematic of an implementation of a traditional data center or server cooling system.
Figure 3:
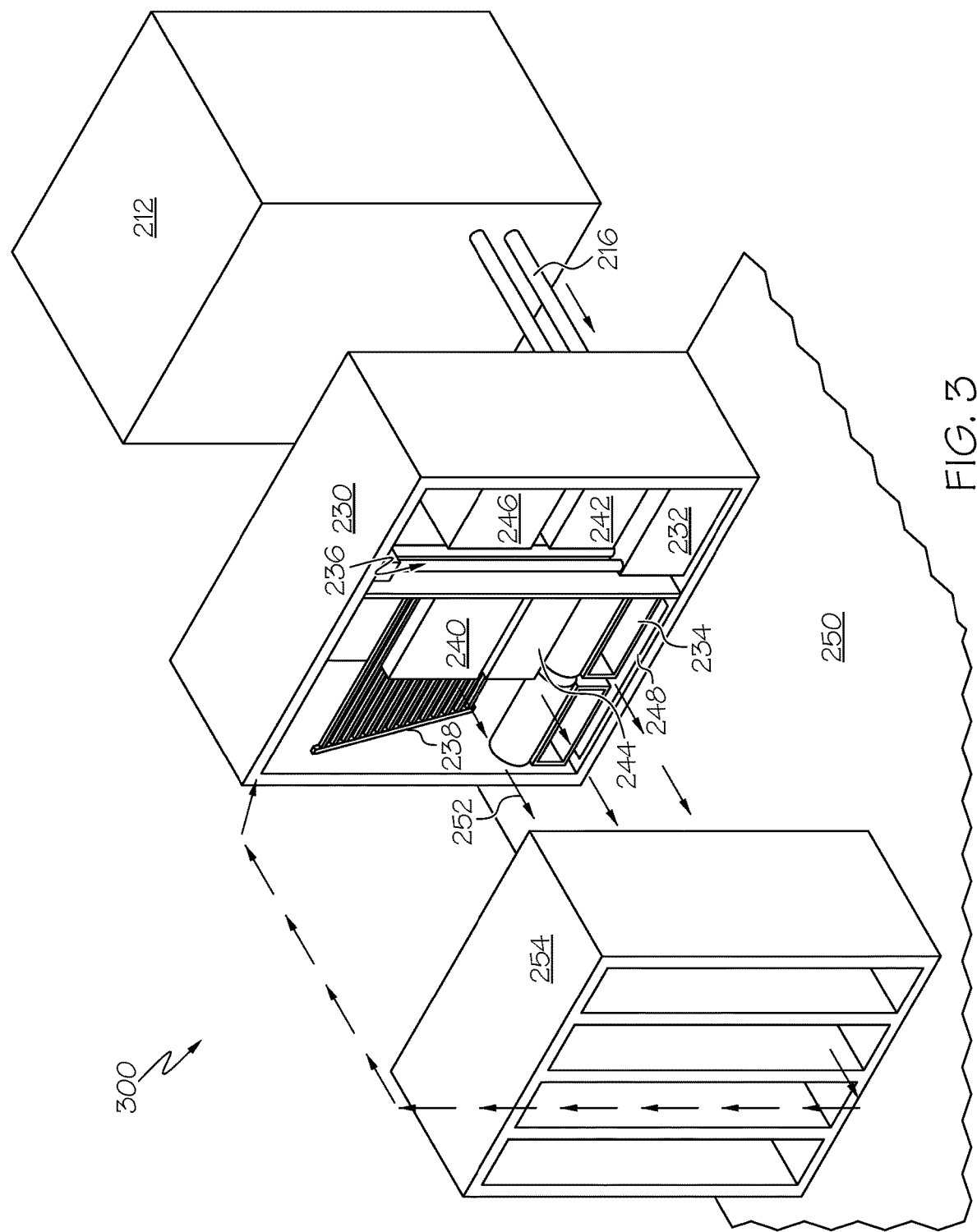
FIG. 3 shows a three-dimensional model of the traditional data center or server cooling system of FIG. 2.

Moving on, before embodiments of the present invention are described in greater detail, it will be necessary, with reference to FIG. 2 and FIG. 3, to provide a general overview of data center cooling systems as found in the current art. Accordingly, referring to FIG. 2, a schematic of a traditional data center or server cooling implementation 200 is shown. Referring to FIG. 3, the same traditional data center or server cooling implementation is shown as a three-dimensional model 300. Traditional cooling implementation 200 generally relies on controlling several environmental variables, including air supply or return temperature, air flow, chilled coolant supply temperature, chilled coolant flow, and room humidity, in order to cool servers or other computer systems. While the design of traditional cooling implementation 200 can be very complex, generally the goal of such a system is to minimize energy costs while adjusting the environmental variables to cool computer systems.

Servers and other computer systems are typically housed in one or more rooms within a building, such as a data center. Traditional cooling implementation 200 may be incorporated into a building's building management system (BMS) 210 and may use components of BMS 210. BMS 210 may be a computer system and/or computer infrastructure, such as that shown in FIG. 1, which controls operates components of a cooling system 230.

BMS 210 may be in contact with a chilled water (CHW) or other chilled coolant temperature controller 220 for controlling a chiller 212 which chills coolant 214. Coolant 214 may be any coolant material, such as a refrigerant, water, distilled water, air, or any other liquid or gas used for cooling. BMS 210 may instruct CHW temperature controller 220 to chill coolant 214 to a specified temperature 222. In traditional cooling implementation 200, coolant 214 is generally chilled to a temperature between 6 and 10 degrees Celsius (or between 42 and 50 degrees Fahrenheit). Accordingly, CHW temperature controller 220 may control the environmental variable of chilled coolant supply temperature.

BMS 210 may further, through a set of valves and/or pumps, control flow of coolant 214 through a set of coolant pipes 216 connected to chiller 212 that transport coolant 214 to traditional cooling system 230. Coolant 214 may be moved through pipes 216 by a flow control mechanism, such as a variable frequency drive (VFD) pump, that creates and maintains a pressure differential. Pipes 216 generally form a closed system that both transports coolant 214 to traditional cooling system 230 and returns coolant 214 back to chiller 212. At the least, an outflow coolant pipe 216A of coolant pipes 216 is protected by insulation 236 to eliminate condensation and to minimize pre-warming of the coolant and, depending on whether returning coolant 214 is expected to be warmer or colder than ambient temperature, a return coolant pipe 216B may also be protected by insulation 236 to decrease the cost of re-cooling coolant 214.

BMS 210 may include a variable flow controller 224 that operates a VFD pump 218 that controls the flow of coolant 214. VFD pump 218 may be used to reduce or increase flow of coolant 214 through chiller 212 in order to maintain a minimum flow required by chiller 212. Pressure differential sensor 226 monitors and provides feedback to BMS 210 on a pressure drop of coolant 214 within traditional cooling system 230, thereby allowing traditional cooling system 230 to adjust flow accordingly. In other words, in response to this feedback, BMS 210 instructs variable flow controller 224 to modulate a pump speed of VFD pump 218 to keep the pressure differential within traditional cooling system 230 constant. Therefore, variable flow controller 224 may control the environmental variable of chilled coolant flow.

A chiller bypass safety valve 228 may, in some instances, be placed in parallel with chiller 212. Chiller bypass safety valve 228 may be used to reduce pressure within traditional cooling system 230. For example, in the case that all other valves in traditional cooling system 230 are closed, pressure differential sensor 226 will register an increase in pressure within traditional cooling system 230. In response to this increased pressure, BMS 210 may instruct chiller bypass valve 228 to open. Alternatively, chiller bypass safety valve 228 may be configured to automatically open in response to a pressure reading above a certain threshold.

Moving on, traditional cooling system 230 of traditional cooling implementation 200 may be, for example, a Computer Room Air Conditioning (CRAC) system, an Air Handling Cooling Units (AHCU) system, and/or any other type of Heating, Ventilation and Air Conditioning (HVAC) system. Traditional cooling system 230 may be controlled by a control module 240, which may be connected to BMS 210. Control module 240 may have several components for controlling functions within traditional cooling system 230.

Control module 240 may include a flow controller 242 that operates flow control valve(s) 232 that controls the flow of coolant 214 within traditional cooling system 230. In some instances, flow control valve 232 may work in tandem with or separately from VFD pump 218. As stated above, pressure differential sensor 226 monitors and provides signal feedback to BMS 210 on a pressure drop of coolant 214 within traditional cooling system 230. BMS 210 may instruct flow controller 242 to adjust flow control valve 232 to keep the pressure differential within traditional cooling system 230 constant. In other words, flow control valve 232 may also be used to normalize a pressure drop between pipe 216A coming into traditional cooling system 230 and pipe 216B leaving the cooling system. Flow control valve 232 may further be used to increase or decrease a rate at which coolant 214 enters traditional cooling system 230. Accordingly, flow controller 242 may control the environmental variable of chilled coolant flow.

When coolant enters traditional cooling system 230 through coolant pipes 216 in traditional cooling implementation 200, pipe 216A may also be covered in insulation 236 to prevent premature warming and condensation. Likewise, pipe 216B returning to chiller 212 may be covered in insulation 236 depending on the temperature of coolant 214 in pipe 216B. In any case, as coolant 214 flows from outflow pipe 216A to return pipe 216B, it passes through cooling coil 238, picking up heat energy and carrying this heat energy back to chiller 212. This permits cooling coil 238 to act as a heat sink with respect to traditional cooling system 230. In some instances, an air handler may be used in place of cooling coil 238.

Control module 240 may further include an air flow controller 244 that operates a fan or blower 234. In some traditional cooling systems 230, blower 234 blows or otherwise pushes air over cooling coil 238. In some instances, control of blower 234 can be based on a reading from a sensor that measures a pressure differential of the air. By controlling operation of blower 234, air flow controller 244 may control the environmental variable of air flow. Moreover, as comparatively warmer air passes over cooling coil 238, heat energy from the warmer air is absorbed by cooling coil 238 and passed to coolant 214. This process lowers the temperature of air flowing over cooling coil 238, resulting in cooled air 252 and an air inlet server temperature 258 typically at a temperature between 12 and 20 degrees Celsius. Accordingly, air flow controller 244 may also control the environmental variable of air supply temperature.

Blower 234 may furthermore push cooled air 252 into, within, and/or around data center/server room 250 where one or more computers/servers 254 (e.g., a rack of servers) are located and operating. When cooled air 252 comes into contact with computers/servers 254 that are at a higher temperature than cooled air 252, some of the heat from computers/servers 254 is absorbed by cooled air 252 and carried away from computers/servers 254. This exposure to cooled air 252 allows computers/servers 254 to be cooled through the removal of excess heat energy. After cooled air 252 is warmed by contact with heated computers/servers 254, the air may be routed (e.g., by an intake duct) back to blower 234 for re-cooling. In FIG. 3, the flow of cooled air 252 from blower 234 and cooling coil 238 of traditional cooling system 230, into data center/server room 250, through computers/servers 254 (e.g., a server rack), and then back to traditional cooling system 230 is more clearly shown.

Control module 240 may further include a humidity controller unit 246 that operates a humidifier (not shown) to add humidity to the air around traditional cooling systems 230 and/or in data center/server room 250. The main reason for adding humidity within data center/server room 250 is a low supply temperature of chilled coolant 214 between 6 and 10 degrees Celsius can cause air to lose its moisture. Liquid condensation can form when warmer and humid air comes into contact with cooler surface materials (e.g., outflow coolant pipe 216A or cooling coil 238). Therefore, to prevent air from becoming too dry or too moist, upper and lower humidity control parameters are desirable in data center/server room 250 where electrical machinery is located (particularly if human beings are inhabiting the same space as data center/server room 250). Therefore, humidity controller unit 246 may prompt a humidifier to add moisture into the air at blower 234 and/or within data center/server room 250 when the comparatively colder cooling coil 238 removes humidity from the surrounding air. Traditional cooling system 230 may also include a condensation pan 248 (FIG. 3) for collecting and removing condensed moisture. Accordingly, humidity controller unit 246 may also control the environmental variable of room humidity.

Control module 240 may further receive readings from one or more temperature and/or humidity sensors 256A-N, which may be located at the return, supply, and/or intake of blower 234. These sensors form a chilled coolant variable flow control system by generating feedback to permit control module 240 or BMS 210 to control temperature and/or humidity in data center/server room 250 by adjusting speed of coolant 214 or speed or temperature of cooled air 252. (In traditional cooling system 230, temperature 222 of coolant 214 is typically stable and therefore is not typically adjusted.) For example, if one of sensors 256A-N detects that the air in data center/server room 250 is too warm, BMS 210 may respond by instructing variable flow controller 224 to increase a speed of VFD pump 218 or by instructing control module 240 to instruct flow controller 242 to increase the flow of coolant or blower 234 to increase the speed at which cooled air is supplied. If, in the opposite case, one of sensors 256A-N detects that the air in data center/server room 250 is too cold, BMS 210 or control module 240 may respond, for example, with instructions to decrease the flow of coolant or to decrease the speed cooled air is supplied. In some instances, control module 240 may provide feedback to BMS 210, which then instructs one or more controllers to respond accordingly.

Moreover, it may be, in some instances (e.g., during a dehumidification process), necessary to reheat or mitigate continued cooling of data center/server room 250 and adjust the flow of coolant 214. Because temperature 222 of chilled coolant 214 in traditional cooling implementation 200 is typically between 6 and 10 degrees Celsius, the humidity of data center/server room 250 may fall below an acceptable humidity and/or the temperature of data center/server room 250 may fall below an acceptable temperature (e.g., below typical "room temperature" of 18 degrees Celsius or 64 degrees Fahrenheit, considered the minimum recommended temperature for IT equipment). This may also cause the room environment to be uncomfortable for human operators. Reheating the room can be used to remove excess moisture from the air caused when cooling coil 238 becomes very cold and prompts an increase in humidity. Therefore, sensible heat is added to data center/server room 250 using a heating coil (also called reheat coil) or similar heating device (not shown). This process of cooling and reheating is very inefficient.

Unfortunately, the attempt of traditional cooling system 230 (and overall traditional cooling implementation 200) to minimize energy costs causes the system to be highly complex and in need of constant monitoring and adjustment. Changes in a load on computers/servers 254 can cause the production of heat by computers/servers 254 to vary. This therefore necessitates BMS 210 and/or control module 240 to compensate for the varying computer/server temperatures by adjusting corresponding environmental variables, including air supply temperature, air flow, chilled coolant supply temperature, chilled coolant flow, and room humidity.

This level of complexity increases installation costs of traditional cooling system 230 and/or BMS 210 due to, for example, many control mechanisms (e.g., VFD pump 218, flow control valve 232, pressure independent control valves, or other modulating pumps or valves), BMS mechanisms to control chilled coolant flow through various load side components (e.g., cooling coil 238) and generation side components (e.g., chiller 212, which requires at least a minimum flow), various controllers within traditional cooling system 230 (e.g., flow controller 242, air flow controller 244, and humidity controller 246), and other system components (e.g., blower 234 and coolant pipes 216).

Furthermore, this level of complexity increases capital expense and operational costs of traditional cooling system 230 and/or BMS 210. For example, the several control pumps and/or valves throughout traditional cooling system 230 and BMS 210 and the increased chilled coolant pressure drop caused by the chilled coolant 214 bypass to chiller 212 causes the system to require regular maintenance, increasing energy consumption and maintenance costs.

However, as increased demand is placed on data centers, which in turn consume more power, information technology budgets remain relatively fixed. Therefore, pressure is mounting for information technology providers to reduce the costs associated with data center construction, operation, and maintenance, while also making data centers more efficient. Moreover, because data centers are becoming more virtualized, cooling requirements are becoming higher and more unpredictable. In response, standards bodies, such as the American Society of Heating Refrigeration and Air Conditioning Engineers (ASHRAE), have adopted more relaxed environmental standards for data centers, which allow for higher server air inlet temperatures.

The inventors of the present invention have found that, unlike other types of building environments, data centers can have extremely low latent loads (i.e., the amount of energy necessary to dehumidify air within a building environment). This is because most modern data centers have very few humans occupying the data center space who, if present, would add humidity to the data center by breathing out moist air. Therefore, latent cooling and fresh air within a data center building are typically very low. Instead, data centers tend to have mostly and primarily sensible cooling requirements. The inventors have discovered that, given the low latent load within most data centers, it is possible to raise the temperature of the chilled coolant (e.g., water) to about 19 degrees Celsius (66 degrees Fahrenheit) or even higher, while maintaining an air inlet temperature to servers/computers in a data center within the temperature zone recommended by ASHRAE.

Some of the inventors of the present invention have previously described methods for separating latent cooling from sensible cooling with respect to data center room cooling in United States patent application publication 2014/0053588, entitled "High-Efficiency Data Center Cooling" and having filing date Aug. 22, 2012. Accordingly, these methods will not be reiterated here.

Embodiments of the present invention, as will be described in more detail below, offer several advantages for improving computer technology. In one instance, embodiments remove the need to control the flow of coolant through a cooling coil (or another type of cooling structure). Furthermore, embodiments of the present invention remove the need for pipe insulation or drainage (e.g., a drainage pan) within a cooling system by preventing the formation of condensation. This allows for the elimination of several components and their controllers from cooling systems already known in the art, such as a CRAC system. Accordingly, these modifications simplify the complexity of existing cooling systems, and therefore, a cooling system, as modified by embodiments of the present invention, will require less maintenance and offer improved operational reliability and availability. Furthermore, embodiments of the present invention will lower capital expenses and overall operation and maintenance costs associated with data center cooling systems. Meanwhile, it will still be possible to control the environmental conditions within the server room or data center.

Figure 4:
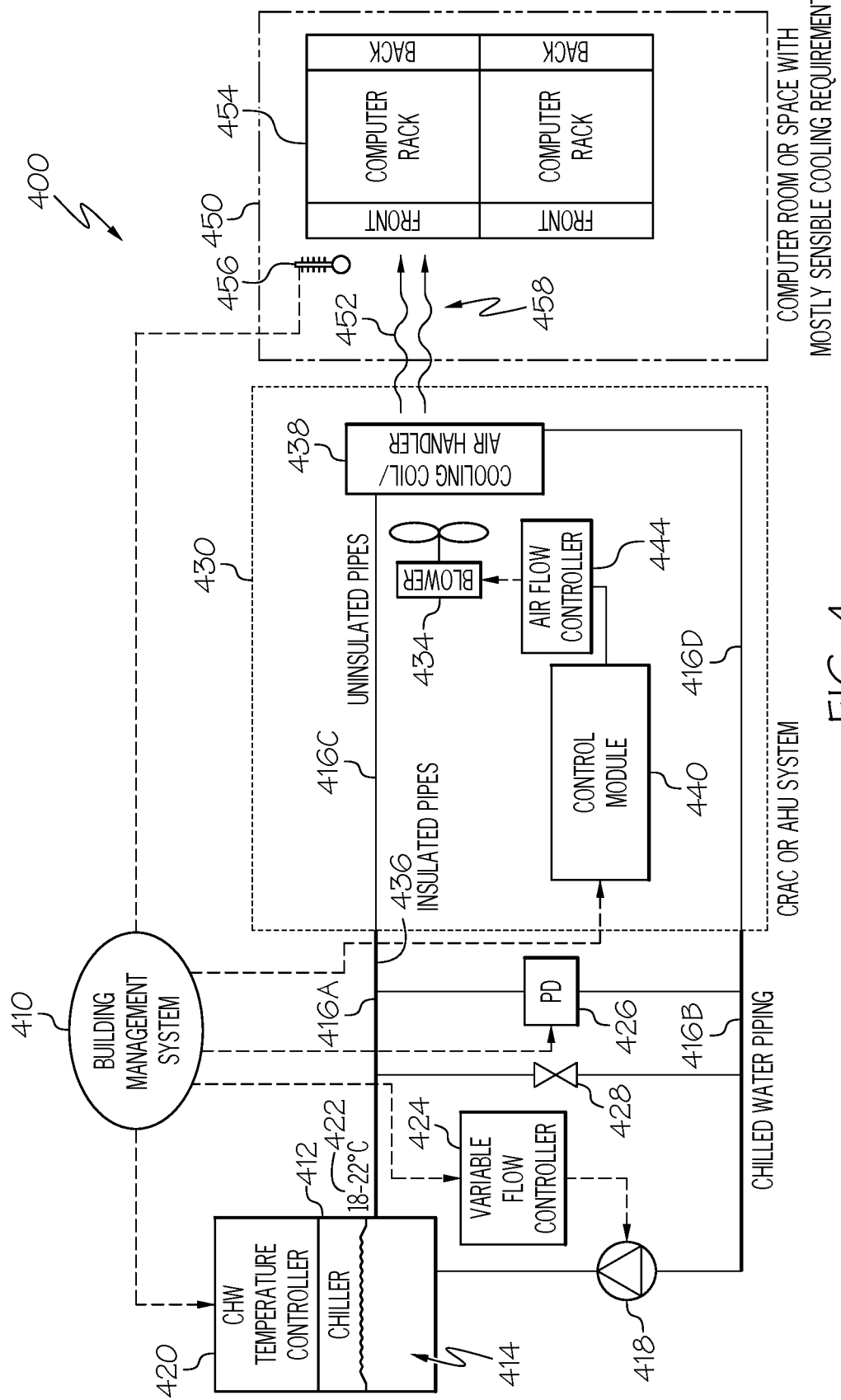
FIG. 4 shows a schematic of an implementation of a data center or server cooling system according to illustrative embodiments.

Referring now to FIG. 4 and FIG. 5, with references to FIG. 2 and FIG. 3, a simplified data center cooling system according to illustrative embodiments of the present invention is shown. FIG. 4 shows a schematic of an implementation 400 of a simplified data center or server cooling system (also referred to as a KaPa cooling system) according to illustrative embodiments, while FIG. 5 shows a three-dimensional model 500 of the simplified data center or server cooling system of FIG. 4 according to illustrative embodiments. It should be understood that implementation 400 of a simplified data center or server cooling system contains several components and features in common with traditional data center or server cooling implementation 200. Some of these components and features will only be discussed in passing below. Therefore, it should be understood that, unless otherwise stated, any component or feature shown in implementation 400 has the same characteristics and function as its counterpart component shown in implementation 200. Counterpart components may be indicated with 2XY and 4XY nomenclature in FIG. 2 and FIG. 4, respectively. In some embodiments, building management system (BMS) 410 can be computer system/server 102 of FIG. 1.

According to embodiments of the present invention, coolant 414 is chilled to a temperature 422 between 18 and 22 degrees Celsius (or between 64 and 72 degrees Fahrenheit) and supplied to a simplified cooling system 430 to cool a data center/server room 450. This can be accomplished by a chilled water (CHW) or other chilled coolant temperature controller 420 (which may be controlled by BMS 410) instructing a chiller 412 to chill coolant 414 to a temperature between 18 and 22 degrees Celsius. Coolant 414 can travel through coolant pipes 416 (which can be uninsulated pipes 416C and 416D within simplified cooling system 430) to a cooling coil 438 or a similar cooling apparatus, before returning to chiller 412.

It should be understood that although embodiments of the present invention will be described primarily with a temperature 422 of coolant 414 between 18 and 22 degrees Celsius, in some embodiments, temperature 422 can be higher than 22 degrees Celsius. The ASHRAE recommended zone for IT equipment is likely to rise in the future as methods are developed for manufacturing computerized equipment to be more resilient to heat. Therefore, in some embodiments, coolant 414 may have a temperature of, for example, 25 degrees Celsius (77 degrees Fahrenheit).

Using a coolant inlet temperature of between 18 and 22 degrees Celsius at cooling coil 438 allows a desired room temperature of data center/server room 450 within the ASHRAE recommended zone for IT equipment to be achieved more easily, simply, and consistently as compared with using a coolant inlet temperature of between 6 and 10 degrees Celsius in traditional cooling system 230. In traditional cooling system 230, BMS 210 and/or control module 240 must continuously monitor and adjust environmental variables to maintain a desired room temperature. Heat from computers/servers 254 must be compensated with cooled air 252, resulting in sinusoid-like temperature fluctuations which may dip or peak outside of an acceptable temperature range. Dips below the acceptable temperature range can trigger undesirable condensation and/or humidity. By contrast, when coolant 414 is set at a temperature of 18-22 degrees Celsius, such that the resulting air inlet server temperature 458 of cooled air 452 at cooling coil 438 is the same as the desired temperature of data center/server room 450, temperature 422 of coolant 414 becomes the lower limit of the temperature of data center/server room 450. Therefore, regardless of a quantity of heat produced by computers/servers 454, the room temperature of data center/server room 450 will always return, asymptote-like to that lower limit. Moreover, the room temperature of data center/server room 450 cannot dip below temperature 422, which thereby prevents both condensation and wasting energy cooling and reheating data center/server room 450. In some embodiments, the air of data center/server room 450 can be held in a closed system, such that the air continuously cycles between being cooled by cooling coil 438 and cooling computers/servers 454.

Furthermore, because temperature 422 of coolant 414 supplied to simplified cooling system 430 and data center/server room 450 is at the ASHRAE recommended zone for IT equipment and higher than temperature 222 of coolant 214 supplied to traditional cooling system 230 and data center/server room 250, it is possible to eliminate several components that would normally be found in traditional cooling system 230, thereby forming simplified cooling system 430.

To begin with, insulation 436 can be eliminated from portions of coolant pipes 416. While, according to embodiments of the present invention, outflow coolant pipe 416A and return coolant pipe 416B can be insulated to help maintain temperature 422 of coolant 414, cooling system pipes 416C and 416D can be uninsulated. This is because, as discussed above, the desired temperature of data center/server room 450 is the same as temperature 422 of coolant 414. Accordingly, permitting coolant 414 to come into thermal contact with the air of data center/server room 450 allows coolant to better return or maintain the desired temperature of data center/server room 450. In other words, no insulation is required on coolant pipes inside the controlled data center/server room environment, while all pipes outside this environment remain insulated to prevent condensation and thermal loss.

Further, chilled coolant flow control mechanisms can be eliminated from simplified cooling system 430. In embodiments of the present invention, there is no need to increase or decrease the flow of coolant 414 to adjust the temperature of data center/server room 450, and adjustments to coolant flow may simply be used to optimize power usage of VFD pump 418 versus power usage of chiller 412. Therefore, flow control valve(s) 232 of traditional cooling system 230 can be eliminated from simplified cooling system 430 of the present invention, and instead, only VFD pump 418 is used to move coolant 414 through simplified cooling system 430. As needed to optimize power usage, variable flow controller 424 can instruct VFD pump 418 to adjust the flow of coolant 414 anywhere between a minimum flow required for chiller 412 and a maximum required flow for the load of data center/server room 450. Minimum and maximum flows can be adjusted as system components or loads are added or reduced from data center/server room 450. Eliminating flow control valve 232 from simplified cooling system 430 reduces the cost of manufacturing simplified cooling system 430. Furthermore, VFD pump 418 does not, in contrast to the combination of flow control valve 232 and VFD pump 218, cause a pressure drop between different portions of pipes 416. (Although a pressure differential sensor 426 and a chiller bypass safety valve 228 may be included in some simplified cooling systems 430.) Accordingly, eliminating flow control valve 232 from simplified cooling system 430 also reduces operating and maintenance costs of simplified cooling system 430 and permits more efficient operation of simplified cooling system 430.

Additionally, several control modules can be eliminated from simplified cooling system 430. For example, because simplified cooling system 430 of embodiments of the present invention does not require, as discussed above, flow control valve(s) 232 as found in traditional cooling system 230, simplified cooling system 430 also does not require a flow controller 242. Furthermore, humidity controller 246, a humidifier/dehumidifier system, a reheat system, and a condensation pan 248 or other condensation collector, as found in cooling system 230, can be eliminated from simplified cooling system 430. This is because temperature 422 of coolant 414 is 18-22 degrees Celsius and data centers that are not inhabited by human beings tend to have little to negligible latent loads, thereby making these components unnecessary. In some embodiments of the present invention, humidity control is performed by a system such as that described in United States patent application publication 2014/0053588, referenced above. Such a system may have a scaled-down humidity controller and/or a smaller condensation pan, as compared to humidity controller unit 246 and condensation pan 248 of traditional cooling system 230. In any case, elimination or reduction of these control modules will further reduce operating and maintenance costs of simplified cooling system 430 and permit more efficient operation of simplified cooling system 430.

Moreover, simplified cooling system 430 can be simplified such that a blower or fan 434, which pushes/pulls air through cooling coil 438, is the only component of simplified cooling system 430 remaining that may be associated with some form of control logic. In some embodiments, simplified cooling system 430 may have an airflow controller 444 (in communication with control module 440 and/or BMS 410) that controls and adjusts blower 434. In other embodiments, control of blower 434 can be handled directly by control module 440 or BMS 410. More specifically, in some embodiments, BMS 410 can directly control all components of data center/server cooling system implementation 400, including simplified cooling system 430, coolant chilling, and coolant flow.

Furthermore, several feedback sensors of the chilled coolant variable flow control system can be eliminated. However, in some instances it may be desirable to retain in simplified cooling system 430 the several temperature/humidity sensors 256A-N of cooling system 230 in order to, for example, make a diagnostic in the case of a malfunction of simplified cooling system 430. In traditional cooling system 230, each of temperature/humidity sensors 256A-N can provide feedback to a corresponding component of the load side or the generation side. However, in embodiments of the present invention, an area temperature sensor 456 can be placed at just one of a coolant return, a coolant supply, or an air intake of blower 434 or coiling coil 438. Single temperature sensor 456 can read air inlet server temperature 458 and provide feedback directly to BMS 410, which in turn can vary the temperature of coolant 414 using temperature controller 420, based solely on the air inlet server temperature 458, through both the load side and generation side of data center/server cooling system implementation 400. In some instances, BMS 410 can also first vary the flow of coolant 414 using variable flow controller 424 because a relatively small reduction in pump speed can reduce power usage significantly (e.g., a 20% reduction in pump speed can reduce power consumption of the pump by about half). These processes allow BMS 410 to control the temperature of center/server room 450. In some embodiments, single temperature sensor 456 can be an array of temperature sensors in data center/server room 450 and the air inlet temperature used by BMS 410 can be the worst air inlet temperature (i.e., the hottest) or an average temperature within an aisle or room of data center/server room 450.

Accordingly, embodiments of the present invention permit BMS 410 to vary temperature 422 of coolant 414 between 18 and 22 degrees Celsius, in addition to varying the flow of coolant 414, while maintaining a maximum server air inlet temperature of, for example, about 25 degrees Celsius, or any other desired temperature within ASHRAE recommended or allowable temperature zones. Accordingly, BMS 410 can directly control the temperature of data center/server room 450, temperature 422 of coolant 414, and the flow of coolant 414. This offers the benefits of reducing balancing efforts requiring multiple components due to flow and temperature variations, as well as improving operation of chiller 412 by providing constant coolant flow through chiller 412, which allows chiller 412 to have better, more consistent control over temperature 422 of coolant 412.

To operate simplified cooling system 430, BMS 410 first starts VFD pump 418, which eventually reaches full speed, and chiller 412 to chill coolant 414 to a set temperature, such as 18 degrees Celsius. Unless data center/server room 450 has a full load, temperature in data center/server room 450 should be lower than the set point, in which case BMS 410 can reduce the speed of VFD pump 418. For example, a 20% reduction in pump speed can reduce power consumption of a typical pump by about half while not having any significant impact on the capacity of simplified cooling system 430. If the temperature in center/server room 450 still remains under a desired temperature, then BMS 410 can increase temperature 422 of coolant 414 (e.g., up to 22 or 23 degrees Celsius). When the temperature in data center/server room 450 begins to increase or raise above an upper temperature threshold (e.g., when data center/server room 450 has a full load), BMS 410 can perform these steps in reverse, lowering temperature 222 of coolant 414 and increasing the speed of VFD pump 418 up to its maximum.

It should be understood that embodiments of the present invention can have many applications, which will not be described exhaustively here, but should be apparent to a person trained in the relevant art in light of this disclosure. For example, data center cooling systems, such as a Computer Room Air Conditioning (CRAC), an Air Handling Cooling Units (AHCU) system, or any other type of Heating, Ventilation and Air Conditioning (HVAC) system, can be manufactured to follow the features of embodiments of the present invention. In other words, a simplified CRAC unit can be made of a CRAC box, a cooling coil, and a fan, without the need for coolant flow control valves, controllers or control logic for fluid control mechanisms, a reheating system, a traditional drain pan, insulation, or traditional humidifiers. In another example, a simplified data center cooling systems can be built up from an existing cooling system or built off of a building management system, again using a CRAC box, a cooling coil, and a fan, while removing or not including coolant flow control valves, controllers or control logic for fluid control mechanisms, a reheating system, a traditional drain pan, insulation, or traditional humidifiers.

Moreover, in another example, a building management system can be programed and/or configured to control the temperature of a cooling system's coolant to between 18 and 22 degrees Celsius based on an IT load requirement and/or a room temperature of a data center or server room. It should also be understood that, in some embodiments, the building management system can be programed and/or configured to control coolant temperature to a temperature above 22 degrees Celsius if so desired to maintain server inlet temperature within ASHRAE mandated allowable zones. The building management system can also be programed and/or configured to control coolant flow within both the cooling and the building systems to between a minimum flow required by a coolant chiller and a maximum flow associated with a full IT load within the data center or server room.

As depicted in FIG. 6, in one embodiment, a system (e.g., computer system/server 102) carries out the methodologies disclosed herein. Shown here is a process flowchart 600 for cooling a data center with a simplified cooling system having a relatively high chilled coolant temperature. At 602, BMS 410 receives a reading from temperature sensor 456 located in data center 450. At 604, BMS 410 determines, based on the received reading, a set of adjustments to temperature 222 of coolant 414 to most efficiently return data center 450 to a desired temperature. At 606, BMS 410 instructs coolant chiller controller 420 to chill coolant 414 at chiller unit 412 to a selected temperature, based on the determination, between 18 and 22 degrees Celsius.

Process flowchart 600 of FIG. 6 illustrates the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Some of the functional components described in this specification have been labeled as systems, units, or controllers in order to more particularly emphasize their implementation independence. For example, a system, unit, or controller may be implemented as a hardware circuit comprising custom VLSI circuits or gate arrays, off-the-shelf semiconductors such as logic chips, transistors, or other discrete components. A system, unit, or controller may also be implemented in programmable hardware devices such as field programmable gate arrays, programmable array logic, programmable logic devices, or the like. A system, unit, or controller may also be implemented in software for execution by various types of processors. A system, unit, or controller or component of executable code may, for instance, comprise one or more physical or logical blocks of computer instructions, which may, for instance, be organized as an object, procedure, or function. Nevertheless, the executables of an identified system, unit, or controller need not be physically located together, but may comprise disparate instructions stored in different locations which, when joined logically together, comprise the system, unit, or controller and achieve the stated purpose for the system, unit, or controller.

Further, a system, unit, or controller of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices and disparate memory devices.

Furthermore, systems/units may also be implemented as a combination of software and one or more hardware devices. In a further example, a system, unit, or controller may be the combination of a processor that operates on a set of operational data.

As noted above, some of the embodiments may be embodied in hardware. The hardware may be referenced as a hardware element. In general, a hardware element may refer to any hardware structures arranged to perform certain operations. In one embodiment, for example, the hardware elements may include any analog or digital electrical or electronic elements fabricated on a substrate. The fabrication may be performed using silicon-based integrated circuit (IC) techniques, such as complementary metal oxide semiconductor (CMOS), bipolar, and bipolar CMOS (BiCMOS) techniques, for example. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor devices, chips, microchips, chip sets, and so forth. However, the embodiments are not limited in this context.

Any of the components provided herein can be deployed, managed, serviced, etc., by a service provider that offers to deploy or integrate computing infrastructure with respect to a process for performing embodiments of the present invention. Thus, embodiments herein disclose a process for supporting computer infrastructure, comprising integrating, hosting, maintaining, and deploying computer-readable code into a computing system (e.g., computer system/server 102), wherein the code in combination with the computing system is capable of performing the functions described herein.

In another embodiment, the invention provides a method that performs the process steps of the invention on a subscription, advertising, and/or fee basis. That is, a service provider, such as a Solution Integrator, can offer to create, maintain, support, etc., a process for performing embodiments of the present invention. In this case, the service provider can create, maintain, support, etc., a computer infrastructure that performs the process steps of the invention for one or more customers. In return, the service provider can receive payment from the customer(s) under a subscription and/or fee agreement, and/or the service provider can receive payment from the sale of advertising content to one or more third parties.

Also noted above, some embodiments may be embodied in software. The software may be referenced as a software element. In general, a software element may refer to any software structures arranged to perform certain operations. In one embodiment, for example, the software elements may include program instructions and/or data adapted for execution by a hardware element, such as a processor. Program instructions may include an organized list of commands comprising words, values, or symbols arranged in a predetermined syntax that, when executed, may cause a processor to perform a corresponding set of operations.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is apparent that there has been provided herein approaches to performing embodiments of the present invention. While the invention has been particularly shown and described in conjunction with exemplary embodiments, it will be appreciated that variations and modifications will occur to those skilled in the art. Therefore, it is to be understood that the appended claims are intended to cover all such modifications and changes that fall within the true spirit of the invention.

What is claimed is:

1. A system for cooling a data center, the system comprising:
    a cooling system comprising:
        a closed circuit of piping through which a coolant flows, a portion of the closed circuit of piping within an area of the data center having less insulation than a portion of the closed circuit of piping not within the area of the data center;
        a coolant chilling unit;
        an air cooling unit, wherein the coolant flows from the coolant chilling unit to the air cooling unit via the piping uninterrupted by any flow control mechanism; and
        a flow control mechanism downstream from the air cooling unit and prior to the coolant chilling unit, wherein the flow control mechanism alone moves the coolant through the closed circuit of piping; and
    a building management system comprising:
        a memory medium comprising program instructions;
        a bus coupled to the memory medium; and
        a processor, for executing the program instructions, that when executing the program instructions causes the building management system to cause the flow control mechanism to control the flow of coolant through the closed circuit of piping.

2. The system for cooling the data center of claim 1, the system further comprising a temperature sensor that registers a temperature of the data center.

3. The system for cooling the data center of claim 2, the instructions further causing the building management system to:
    receive temperature information from the temperature sensor;
    determine, based on the received reading, a set of adjustments to the temperature of the coolant to most efficiently return the data center to a desired temperature; and cause the cooling system to adjust a temperature of the coolant based on the received sensor information.

4. The system for cooling the data center of claim 1, the temperature the coolant chilling unit chills the coolant to being a recommended temperature of the data center, wherein a temperature of the data center cannot fall below the recommended temperature.

5. The system for cooling the data center of claim 1, the instructions further causing the building management system to cause the cooling system to adjust a temperature of the coolant to between 18 and 22 degrees Celsius based on an IT load requirement of the data center.

6. The system for cooling the data center of claim 1, the instructions further causing the building management system to cause the cooling system to adjust, based on a temperature reading in the data center, a flow of the coolant through the coolant chilling unit using the control mechanism.

7. The system for cooling the data center of claim 6, wherein the flow of the coolant is adjusted to a flow between, at minimum, a flow rate required by the coolant chilling unit and, at maximum, a flow rate required by a full data center load.

8. The system for cooling the data center of claim 1, wherein the closed circuit of piping does not comprise a set of flow control valves nor a flow controller for operating the set of flow control valves.

9. The system for cooling the data center of claim 1, wherein the control mechanism is a variable frequency drive (VFD) pump.

10. The system for cooling the data center of claim 1, wherein the cooling system does not comprise internal control logic.

11. The system for cooling the data center of claim 1, wherein the cooling system is a Computer Room Air Conditioning (CRAC) system or an Air Handling Cooling Units (AHCU) system and the air cooling unit comprises an air blower and a cooling coil.

12. A method for cooling a data center with a cooling system, the method comprising:
receiving a reading from a temperature sensor located in the data center;
determining, based on the received reading, a set of adjustments to a flow of coolant to most efficiently return the data center to a desired temperature; and
adjusting a flow of the coolant through the cooling system only though a control mechanism disposed downstream from the data center, between the data center and a chiller unit, wherein a portion of the cooling system within an area of the data center has less insulation than a portion of the cooling system not within the area of the data center.

13. The method of claim 12, the method further comprising:
determining, based on the received reading, a set of adjustments to a temperature of the coolant to most efficiently return the data center to a desired temperature; and
instructing, based on the determination, a coolant chiller controller to chill the coolant at the chiller unit to a selected temperature between 18 and 22 degrees Celsius.

14. The method of claim 13, the selected temperature of the coolant being a desired temperature of the data center, wherein a temperature of the data center is not to be permitted to fall below the desired temperature.

15. The method of claim 12, the method further comprising instructing an air blowing unit at the data center to blow air at a selected rate across a heat transfer surface based on the received reading.

16. The method of claim 12, wherein the cooling system is a Computer Room Air Conditioning (CRAC) system or an Air Handling Cooling Units (AHCU) system.

17. A computer program product for cooling a data center with a cooling system, the computer program product comprising a computer readable storage device, and program instructions stored on the computer readable storage device, to:
receive a reading from a temperature sensor located in the data center;
determine, based on the received reading, a set of adjustments to a flow of coolant to most efficiently return the data center to a desired temperature; and
adjust a flow of the coolant through the cooling system only though a control mechanism disposed downstream from the data center, between the data center and a chiller unit, wherein a portion of the cooling system within an area of the data center has less insulation than a portion of the cooling system not within the area of the data center.

18. The computer program product of claim 17, the computer readable storage device further comprising instructions to:
determine, based on the received reading, a set of adjustments to a temperature of the coolant to most efficiently return the data center to a desired temperature; and
instruct, based on the determination, a coolant chiller controller to chill the coolant at the chiller unit to a selected temperature between 18 and 22 degrees Celsius.

19. The computer program product of claim 18, the selected temperature of the coolant being a desired temperature of the data center, wherein a temperature of the data center is not to be permitted to fall below the desired temperature.

20. The computer program product of claim 17, the computer readable storage device further comprising instructions to instruct an air blowing unit at the data center to blow air at a selected rate across a heat transfer surface based on the received reading.

* * * * *